United States Patent

[11] 3,617,828

[72] Inventor Samyon E. Daniluk
Camillus, N.Y.

[21] Appl. No. 860,504
[22] Filed Sept. 24, 1969
[45] Patented Nov. 2, 1971
[73] Assignee General Electric Company

[54] SEMICONDUCTOR UNIJUNCTION TRANSISTOR DEVICE HAVING A CONTROLLED CROSS-SECTIONAL AREA BASE CONTACT REGION
1 Claim, 3 Drawing Figs.

[52] U.S. Cl. .......... 317/235 R, 317/234 R, 317/235 C, 317/235 AE, 317/235 AM
[51] Int. Cl. .......... H01l 11/14
[50] Field of Search .......... 317/234 (263), 234 (44), 234 (48.1)

[56] References Cited
UNITED STATES PATENTS

| | | | |
|---|---|---|---|
| 3,325,705 | 6/1967 | Clark | 317/235 |
| 3,337,783 | 8/1967 | Stehney | 317/235 |

*Primary Examiner*—John W. Huckert
*Assistant Examiner*—B. Estrin
*Attorneys*—Robert J. Mooney, Nathan J. Cornfeld, Frank L. Neuhauser, Oscar B. Waddell and Joseph B. Forman

ABSTRACT: A semiconductor device including a contact region of one conductivity region having a predetermined cross-sectional area is provided with a surrounding collar-shaped semiconductor region of opposite conductivity type, which region effectively blocks the spreading action of the contact region thereby controlling its resistance to a constant value.

INVENTOR:
SAMYON E. DANILUK,
BY Robert J. Mooney
HIS ATTORNEY.

SEMICONDUCTOR UNIJUNCTION TRANSISTOR DEVICE HAVING A CONTROLLED CROSS-SECTIONAL AREA BASE CONTACT REGION

This invention relates to semiconductor devices and more specifically it relates to a contact electrode region formed in these devices having a constant cross-sectional area.

Semiconductor devices formed by planar processing techniques generally comprise semiconductor wafers including various diffused or deposited regions of suitable conductivity type and which also include electrodes connected to certain of these regions thereby forming electrical devices. Such devices may be active such as transistors and diodes or may be passive such as resistors and capacitors. Several of these semiconductor devices include a high-resistance region, for example the base one region of a unijunction transistor, which in physical size are very small compared to the rest of the semiconductor device. The physical size of this region determines its resistance (i.e. the larger the cross-sectional area of the region the lower its resistance) and since this largely determines the electrical characteristics of the device as a whole, it is necessary to accurately determine the dimensions of this region and also to insure that these dimensions do not change during the useful operational life of the device. However, in some devices where the contact region is of similar conductivity type to the surrounding semiconductor substrate material, although perhaps of different resistivities, a troublesome problem exists in that during the operation of the electrical device certain biases, either electrical or physical, on the contact region cause it to spread into the surrounding semiconductor substrate material thereby effectively enlarging its physical dimensions. This spreading causes the resistance of the contact region to change during the operation of the device which in turn causes the electrical characteristics of the device to vary. It would be desirable to eliminate the problem of spreading of contact regions during the operation of the semiconductor devices.

It is therefore an object of this invention to provide a semiconductor device which eliminates the problem of spreading.

It is another object of this invention to provide a semiconductor device wherein the cross-sectional area dimensions of contact regions are held constant during the operational life of the device.

It is another object of this invention to provide semiconductor devices in which the electrical characteristics intrinsic to the device remain constant.

Briefly these objects are achieved in a device in which contact regions of one conductivity type having a predetermined cross-sectional area are provided with a surrounding semiconductor region of opposite conductivity type, which region effectively blocks the spreading action of the contact region thereby effectively controlling its resistance to a constant value.

This invention is distinctly set forth in the appended claims. The invention, however, both as to its organization and operation may best be understood with reference to the following specifications taken in conjunction with the following figures in which, FIG. 1 is a cross-sectional view of a semiconductor wafer at one of the preliminary stages in the process of forming a semiconductor device.

Figure 1:
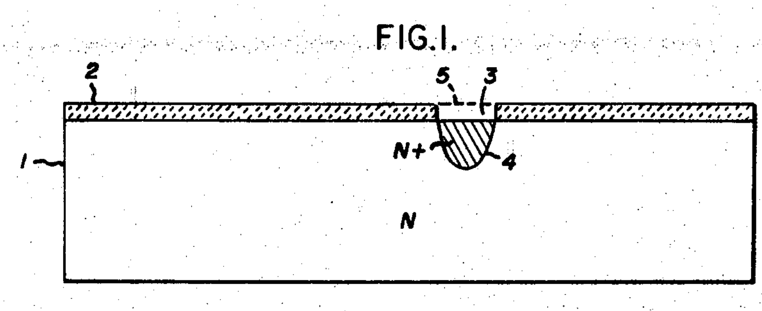

Referring now to FIG. 1, there is shown a semiconductor body or wafer 1, such as silicon which may be for illustrative purposes of N-type conductivity, and which may be utilized in a process for the formation of a unijunction transistor. While the invention may be illustrated in the specific embodiment of a unijunction transistor, this is not to say that the invention is limited thereto; rather, the invention comprehends all semiconductor devices fabricated in accordance with the disclosure and claims.

The semiconductor wafer 1 may, according to normal planar-processing techniques, be provided with an oxide mask 2 including an opening 3 into which a contact region 4 may be diffused. In the specific embodiment of a unijunction transistor this contact may also comprise a base one region 4 of N+ conductivity semiconductor material for a unijunction transistor. The designation N+ normally refers to a highly doped N-type material of very low resistivity compared to the normal N-type semiconductor material 1. A common method of forming N+ regions is to diffuse phosphorous into the semiconductor wafer 1 by vapor transport techniques. Normally the phosphorous diffusion process involves two steps, the first of which is the actual deposition of a certain predetermined amount and concentration of phosphorous on the semiconductor wafer 1 in the region 3, and the second of which involves driving the deposited phosphorous material into the semiconductor wafer to a certain desired depth, usually by elevating the temperature of the region. It is this driving step in the diffusion process that determines the depth to which the N+ region 4 extends into the semiconductor wafer 1, and therefore also determines the resultant resistance of the base one region of the unijunction transistor to be formed. During the driving process phosphorous atoms and also some silicon atoms oxidize thereby forming an oxide coating 5 over the region 3. This, in effect, provides an oxide mask over the region 3 which joins with the original oxide mask 2.

Figure 2:
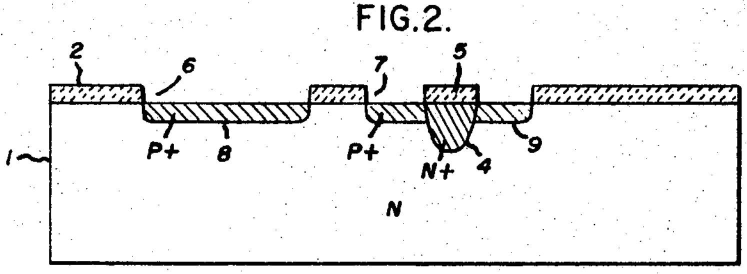
FIG. 2 is the same semiconductor wafer of FIG. 1 after certain operations have been performed thereon, among which includes the formation of one teaching of the present invention.

In FIG. 2 the device of FIG. 1 has been shown remasked to form an opening 6 for the emitter contact of the unijunction transistor and another opening 7 which completely encircles the portion 5 of the oxide mask overlying the base one contact region 4. After the oxide mask has been formed to provide the openings 6 and 7 an overdoped P-type semiconductor material, which may be designated by the insignia P+, is diffused into the openings 6 and 7 to form P+ regions 8 and 9 respectively. Although regular P-type material may be used in this step the resulting devices are found to be of higher quality when P+ material is used. The P+ diffusion may suitably be accomplished by a boron diffusion technique which is similar to the two-step phosphorous diffusion process used in the formation of the N+ region 4. The P+ region 8 forms the emitter region for the unijunction transistor. The P+ region 9 is formed such that it comprises a ring or collar around the N+ region 4 and is actually contiguous with a portion of contact region 4. As will be described in more detail hereinafter, the P+ collar 9 effectively prevents spreading of the base one contact region 4 during the operation of the unijunction transistor.

Figure 3:
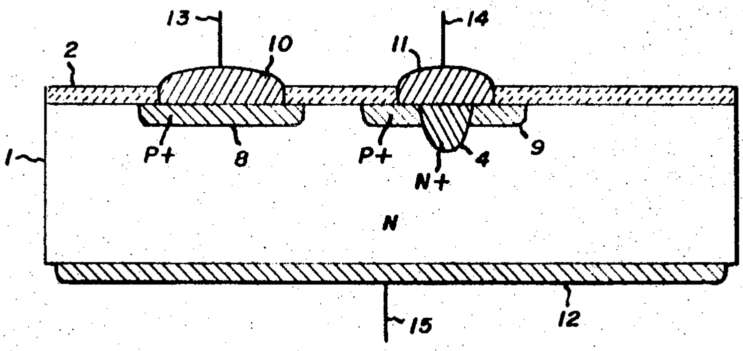
FIG. 3 is the completed device according to further teachings of the present invention.

Referring now to FIG. 3 the final product is shown comprising the unijunction transistor of FIG. 2 with the additional steps being performed thereon including a remasking in order to leave openings for the deposition of aluminum contacts 10 and 11 over the emitter 8 and the base one region 4 respectively. In addition, a base two contact 12 has been deposited on substantially the entire undersurface of the semiconductor wafer 1. Leads 13, 14, and 15 for connection to an external circuit (not shown) are shown connected to the aluminum contacts 10, 11, and 12 respectively.

In the operation of the device of FIG. 3 it will be noted that the base one region 4 comprises an N+ semiconductor material wherein the immediately adjacent semiconductor material of the wafer 1 comprises N-type material. It is in this circumstance that during electrical operation of the device, wherein an electrical bias usually exists on the base one region 4, the tendency of this region to spread out into the adjacent regions of the semiconducotr wafer 1 is most likely to occur. During operation the N+ material 4 creeps into the N-type material 1 and converts it into N+ material of similar resistivity thereby enlarging the total cross-sectional area of the base one region 4 and consequently varying its resistance. Usually the resistance of the base one region 4 will be lowered due to the spreading effect.

While this spreading effect can be detrimental in various ways depending on the type of semiconductor device in which it occurs, in the specific example of a unijunction transistor as shown in FIGS. 1 through 3, the particular detrimental effects that are most apparent are the effects on the intrinsic standoff ratio and the interbase resistance of the unijunction transistor. This can be seen mathematically with reference to the following formulas:

$$\eta=\frac{R_{B1}}{R_{B1}+R_{B2}}$$

and $$R_{BB}=R_{B1}+R_{B2}$$

wherein $\eta$ equals the intrinsic standoff ratio, $R_{B1}$ equals the resistance of the base one, $R_{B2}$ equals the resistance of the base two and $R_{BB}$ equals the interbase resistance. Normally in unijunction transistor devices $R_{B1}$ is considerably higher than the $R_{B2}$ largely due to the fact that it is of such a small area compared to the base two contact. Thus, it can be seen that for small decreases in the resistance of the base one region due to the spreading effect, the $\eta$ will similarly be decreased as will the interbase resistance. Additionally it will be noted that unijunction transistor devices in which this spreading effect occurs cannot be made with a high $\eta$ or $R_{BB}$, which is sometimes desirable.

According to the teachings of the present invention, the P+ ring 9 which completely surrounds a portion of contact region 4 effectively blocks the spreading effect of the base one contact as well as minimizing surface effects thereby insuring that the resistance of the base one contact 4 as originally selected will remain constant. The spreading effect is blocked because the P+ collar 9 maintains a substantial portion of the area around the N+ contact region 4, P type thereby preventing this area from becoming lower resistivity N type which may result in making the cross-sectional area of contact region 4 larger and thereby reduce the resistance of $B_1$. However, it will be understood that the practice and advantages of my invention are not dependent upon any particular theory selected to explain the improved results thus attained.

In the operation of the device of FIG. 3 it was discovered that the semiconductor wafer 1 of N-type material, the P+ collar 9, and the N+ material may effectively comprise a small NPN-junction transistor which may spuriously effect the operation of the unijunction transistor. This spurious operation was found to be completely eliminated by making the hole in the oxide mask 2 where the aluminum contact 11 is deposited to be large enough so that the contact 11 overlaps both the N+ region 4 and the P+ ring 9. By overlapping the aluminum contact in this manner any transistor action that may tend to occur by virtue of the presence of the P+ collar 9 is short circuited.

It should be understood that while the wafer 1 was chosen to be of N-type semiconductor material in the specific embodiment described, the invention is likewise applicable in the case where the original wafer 1 if of a P-type material and the contact region 4 is likewise of P- or P+-type material. In this case the collar 9 which blocks the spreading action will according to the invention be of an N- or N+-type material. Similarly it should be understood that while the specific embodiment used to illustrate the present invention was chosen to be a unijunction transistor, the invention is not limited to this device.

Thus, while the invention has been described in terms of a specific embodiment, various modifications will be apparent to those skilled in the art. Therefore, applicant does not wish to be limited to the specific embodiment disclosed but rather should be given the full benefit of the spirit and scope of the appended claims.

What I claim as new and desire to secure by Letters Patent of the United States is:

1. A semiconductor unijunction transistor comprising, a semiconductor body of one conductivity type having an upper and lower face parallel to each other, said body comprising a base two region of said unijunction transistor;

a first semiconductor region in the upper face of said semiconductor body having a predetermined cross-sectional area, said first semiconductor region being of like conductivity type to said semiconductor body but having a lower resistivity than the remainder of said semiconductor body and comprising a base one region of said unijunction transistor;

an emitter region of said unijunction transistor in the upper surface of said body and being of opposite conductivity type to said body;

a second semiconductor region in the upper surface of said body of opposite conductivity type to said first semiconductor region, said second region contiguously surrounding a portion of said first semiconductor region thereby essentially confining said cross-sectional area of said first region and blocking the spreading of said first semiconductor region toward said emitter region during the operation of said unijunction transistor;

a first metallic electrode in direct contact with said emitter region;

a second metallic electrode in direct contact with said semiconductor body on its lower surface to comprise a base two electrode for said unijunction transistor; and a third metallic electrode in direct contact with said base one region to comprise a base one electrode said third metallic electrode being in direct contact with a portion of both said first and second semiconductor regions.

* * * * *